(12) United States Patent
Kimura et al.

(10) Patent No.: US 10,319,778 B2
(45) Date of Patent: Jun. 11, 2019

(54) LIGHT RECEIVING ELEMENT AND LIGHT RECEIVING DEVICE

(71) Applicant: SUMITOMO ELECTRIC INDUSTRIES, LTD., Osaka (JP)

(72) Inventors: Daisuke Kimura, Osaka (JP); Hiroshi Inada, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/961,064

(22) Filed: Apr. 24, 2018

(65) Prior Publication Data

US 2018/0342545 A1   Nov. 29, 2018

(30) Foreign Application Priority Data

May 26, 2017   (JP) .................................. 2017-104950

(51) Int. Cl.
*H01L 31/00* (2006.01)
*H01L 27/146* (2006.01)
(Continued)

(52) U.S. Cl.
CPC .......... *H01L 27/1465* (2013.01); *H01L 24/11* (2013.01); *H01L 24/13* (2013.01); *H01L 24/16* (2013.01); *H01L 27/14636* (2013.01); *H01L 27/14694* (2013.01); *H01L 31/02005* (2013.01); *H01L 31/02161* (2013.01); *H01L 31/022408* (2013.01); *H01L 31/0304* (2013.01); *H01L 31/035236* (2013.01); *H01L 31/035281* (2013.01); *H01L 31/184* (2013.01); *H01L 2224/13014* (2013.01);
(Continued)

(58) Field of Classification Search
CPC ............................................. H01L 2224/14179
See application file for complete search history.

(56) References Cited

U.S. PATENT DOCUMENTS 6,147,349 A * 11/2000 Ray ...................... H01L 31/103
                                                              250/338.4
2018/0151617 A1* 5/2018 Migita .............. H01L 27/14634

FOREIGN PATENT DOCUMENTS

JP            08-139299         5/1996

OTHER PUBLICATIONS

Yasuhiro Iguchi, et al., "Two-Dimensional Near Infrared Sensor with Low Noise and Wide Wavelength Range", *SEI Technical Review*, No. 182, pp. 103-106, Jan. 2013.

* cited by examiner

Primary Examiner — Reema Patel
(74) Attorney, Agent, or Firm — Smith, Gambrell & Russell, L.L.P.

(57) ABSTRACT

A light receiving element includes: a semiconductor layer including a first layer, a light absorbing layer, a second layer, and a third layer, the semiconductor layer having a plurality of mesas, a terrace, and a groove; a first electrode provided on the mesas and electrically connected to the third layer; a first bump provided on the first electrode and electrically connected to the first electrode; a second electrode provided on a portion extending from the terrace to an inner side of the groove and electrically connected to the first layer; and a second bump larger than the first bump, is provided on the terrace, and is electrically connected to the second electrode, wherein the mesas and the terrace include the semiconductor layer, the groove extends to the first layer, and the second electrode is in contact with the first layer on an inner side of the groove.

10 Claims, 9 Drawing Sheets

(51) Int. Cl.
*H01L 31/0224* (2006.01)
*H01L 31/02* (2006.01)
*H01L 23/00* (2006.01)
*H01L 31/0216* (2014.01)
*H01L 31/0304* (2006.01)
*H01L 31/0352* (2006.01)
*H01L 31/18* (2006.01)

(52) U.S. Cl.
CPC .............. *H01L 2224/13016* (2013.01); *H01L 2224/13109* (2013.01); *H01L 2224/1403* (2013.01); *H01L 2224/14131* (2013.01); *H01L 2224/14179* (2013.01); *H01L 2224/16145* (2013.01); *H01L 2924/3511* (2013.01)

LIGHT RECEIVING ELEMENT AND LIGHT RECEIVING DEVICE

CROSS-REFERENCE TO RELATED APPLICATION

This application is based upon and claims the benefit of priority of the prior Japanese Patent Application No. 2017-104950, filed on May 26, 2017, the entire contents of which are incorporated herein by reference.

BACKGROUND

(i) Technical Field

The present invention relates to a light receiving element and a light receiving device.

(ii) Related Art

Known light receiving elements receive infrared light and generate image information and the like (see Japanese Patent Application Laid-Open No. 8-139299 and Yasuhiro IGUCHI and seven others, "Two-Dimensional Near Infrared Sensor with Low Noise and Wide Wavelength Range", SEI Technical Review, No. 182, pp. 103-106, January 2013). A circuit that reads electric signals from a light receiving element is formed on a substrate, and the substrate and the light receiving element are electrically connected by bumps. Thus, a light receiving device is formed.

SUMMARY

To achieve a high S/N ratio, a light receiving device is sometimes used at low temperature. However, the light receiving element and the substrate have different thermal expansion coefficients from each other, and therefore, stress (thermal stress) is applied to the light receiving element due to a temperature change. Such stress might cause damage to the light receiving device. Therefore, in some cases, a large number of bumps are formed on a light receiving element, to reduce the stress. In such cases, however, the light receiving element becomes larger in size.

In view of the above, the present invention aims to provide a light receiving element and a light receiving device that are capable of preventing damage due to stress, and an increase in size.

According to an aspect of the present invention, there is provided a light receiving element including: a semiconductor substrate formed with a compound semiconductor; a semiconductor layer including: a first layer that is provided on the semiconductor substrate and is of a first conductivity type; a light absorbing layer provided on the first layer; a second layer that is provided on the light absorbing layer and is of a second conductivity type; and a third layer that is provided on the second layer and is of the second conductivity type, the semiconductor layer having a plurality of mesas, a terrace, and a groove formed thereon at a portion extending from a middle portion toward an outer peripheral portion of the semiconductor substrate; a first electrode that is provided on the mesas, and is electrically connected to the third layer; a first bump that is provided on the first electrode, and is electrically connected to the first electrode; a second electrode that is provided on a portion extending from the terrace to an inner side of the groove, and is electrically connected to the first layer; and a second bump that has a larger size than the first bump, is provided on the terrace, and is electrically connected to the second electrode, wherein the mesas and the terrace include the first layer, the light absorbing layer, the second layer, and the third layer, the groove extends to the first layer, and the second electrode is in contact with the first layer on an inner side of the groove.

DETAILED DESCRIPTION

Figure 1A:
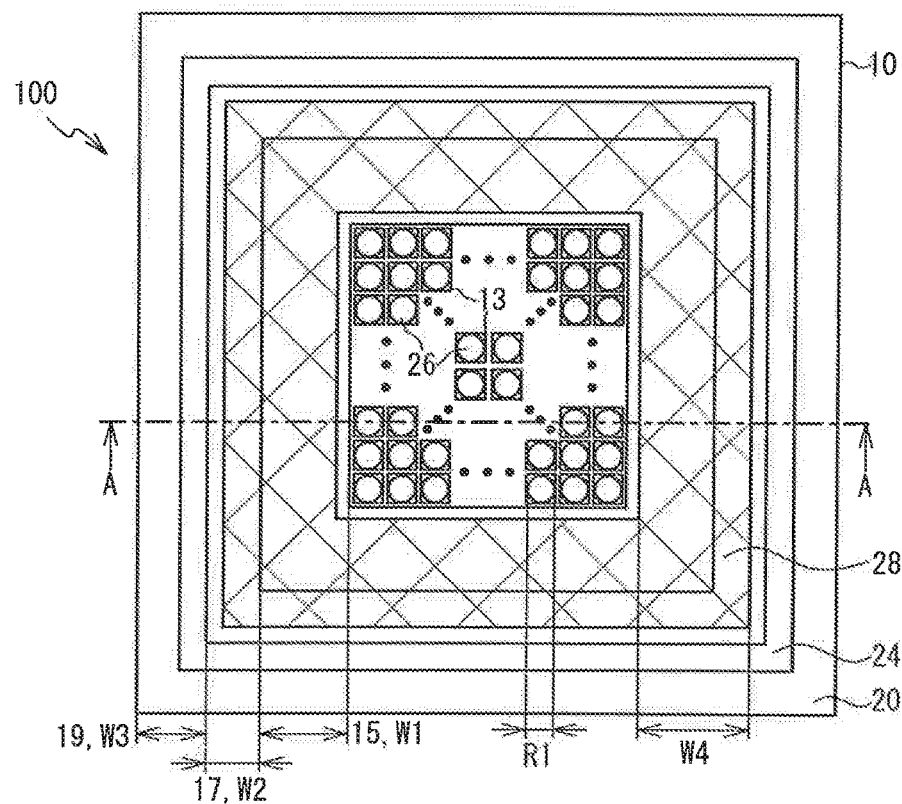
FIG. 1A is a plan view of an example of a light receiving element according to a first embodiment.

Description of Embodiments of the Present Invention

First, the contents of embodiments of the present invention are listed below.

One mode of the present invention is (1) a light receiving element that includes: a semiconductor substrate formed with a compound semiconductor; a semiconductor layer including: a first layer that is provided on the semiconductor substrate and is of a first conductivity type; a light absorbing layer provided on the first layer; a second layer that is provided on the light absorbing layer and is of a second conductivity type; and a third layer that is provided on the second layer and is of the second conductivity type, the semiconductor layer having mesas, a terrace, and a groove formed thereon at a portion extending from the middle portion toward the outer peripheral portion of the semiconductor substrate; a first electrode that is provided on the mesas, and is electrically connected to the third layer; a first bump that is provided on the first electrode, and is electrically connected to the first electrode; a second electrode that is provided on a portion extending from the terrace to the inner side of the groove, and is electrically connected to the first layer; and a second bump that has a larger size than the first bump, is provided on the terrace, and is electrically connected to the second electrode. In this light receiving element, the mesas and the terrace include the first layer, the light absorbing layer, the second layer, and the third layer, the groove extends to the first layer, and the second electrode is in contact with the first layer on the inner side of the groove. The contact area between the second bump and the second electrode is large, and the joint strength is high. Thus, detachment of the second bump from the second electrode is prevented. Furthermore, the stress to be applied to the first bump is smaller than the stress to be applied to the second bump. Thus, damage of the light receiving element due to stress is prevented. Further, there is no need to prepare a large number of reinforcing bumps, and thus, the light receiving element is prevented from becoming larger in size.

(2) The area of the second bump in the direction in which the semiconductor substrate extends may be four or more times larger than the area of the first bump. As the joint strength between the second bump and the second electrode becomes higher, detachment of the second bump from the second electrode is effectively prevented.

(3) The second bump may be provided on a portion extending from the terrace to the inside of the groove, and cover the surface of the second electrode. As the second bump covers the second electrode on the side surfaces of the terrace, breaking of the second electrode is prevented.

(4) The light receiving element may further include an insulating film that covers the respective upper and side surfaces of the mesas and the terrace, the insulating film may have a first opening above the mesas and a second opening on the inner side of the groove, the first electrode may be in contact with the third layer exposed through the first opening, and the second electrode may be in contact with the first layer exposed through the second opening. The second electrode is insulated from the light absorbing layer, the second layer and the third layer by the insulating film. Further, the semiconductor layer can be protected by the insulating film.

(5) The second bump may have a ring-like shape, and surround a region of the semiconductor layer, the mesas being provided in the region. As the second bump is provided across a wide region, the joint strength between the second bump and the second electrode becomes higher, and detachment of the second bump is effectively prevented. Damage of the light receiving element due to stress, and an increase in the size of the light receiving element are also prevented.

(6) The second bump may be formed with second bumps each having a shape that extends along at least two sides of the semiconductor substrate, and the second bumps may be at a distance from one another, form a square, and be located at the respective four corners of the square. With this arrangement, damage of the light receiving element due to stress, and an increase in the size of the light receiving element are prevented.

(7) The second bump may be formed with four columnar bumps, and the four columnar bumps may form a square and be located at the respective four corners of the square. With this arrangement, damage of the light receiving element due to stress, and an increase in the size of the light receiving element are prevented.

(8) The semiconductor substrate may be formed with gallium antimonide. As gallium antimonide has a great thermal expansion coefficient, the semiconductor substrate is greatly deformed, and stress increases. As the second bump has a great width, detachment of the second bump can be prevented, and damage of the light receiving element due to stress can also be prevented.

(9) The first layer may be an n-type superlattice layer, and the second layer may be a p-type superlattice layer. The conductivity type of the second electrode and the second bump that are connected to the first layer is the n-type, and the conductivity type of the first electrode and the first bump that are connected to the third layer is the p-type.

(10) A light receiving device includes the above light receiving element and a silicon substrate. In this light receiving device, the light receiving element is electrically connected to the silicon substrate by the first bump and the second bump. Damage of the light receiving device due to stress is prevented. Also, there is no need to prepare a large number of reinforcing bumps, and thus, the light receiving device is prevented from becoming larger in size. Further, damage of the silicon substrate is prevented.

DETAILED DESCRIPTION OF EMBODIMENTS OF THE PRESENT INVENTION

The following is a description of specific examples of light receiving elements and light receiving devices according to embodiments of the present invention, with reference to the accompanying drawings. It should be noted that the present invention is not limited to these examples, but all modifications thereof are shown in the claims and are included in the spirit and the scope equivalent to the claims.

First Embodiment

Figure 1B:
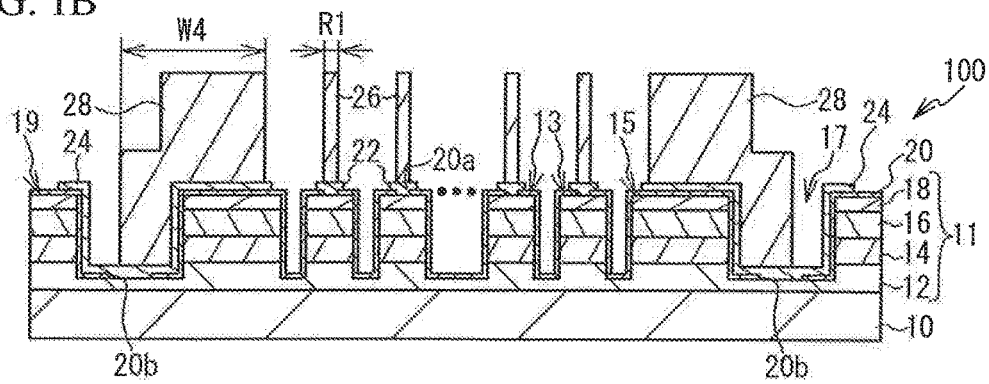
FIG. 1B is a cross-sectional view of the light receiving element, taken along the line A-A defined in FIG. 1A.

FIG. 1A is a plan view of an example of a light receiving element 100 according to a first embodiment. FIG. 1B is a cross-sectional view of the light receiving element 100, taken along the line A-A defined in FIG. 1A. The black dots in the drawings indicate that mesas 13 and the like are provided therein.

(Light Receiving Element 100)

As shown in FIG. 1A, the light receiving element 100 is a rectangular chip, and each side is not shorter than 5 mm and not longer than 20 mm, for example. As shown in FIG. 1B, the light receiving element 100 includes a semiconductor substrate 10 and a semiconductor layer 11. The semiconductor substrate is formed with n-type gallium antimonide (GaSb) that is not thinner than 500 μm and not thicker than 700 μm. The semiconductor layer 11 is formed by stacking an n-type semiconductor layer 12 (the first layer), a light absorbing layer 14, a p-type semiconductor layer 16 (the second layer), and a p-type contact layer 18 (the third layer) in order of proximity to the semiconductor substrate 10. A buffer layer formed with GaSb, for example, may be provided between the n-type semiconductor layer 12 and the semiconductor substrate 10. An antireflection film that prevents light reflection may be provided on the lower surface of the semiconductor substrate 10.

The n-type semiconductor layer 12 has an n-type GaSb/InAs superlattice structure that is formed by stacking a GaSb layer and an indium arsenide layer and is doped with silicon (Si). The n-type semiconductor layer 12 is 1 to 2 μm in thickness, for example. The light absorbing layer 14 has a GaSb/InAs superlattice structure, for example, and is 0.8 to 2 μm in thickness, for example. The p-type semiconductor layer 16 has a p-type GaSb/InAs superlattice structure doped with beryllium (Be), for example, and is 0.2 to 0.6 μm in thickness, for example. A superlattice structure has a type-II band structure. The p-type contact layer 18 is formed with p-type GaSb, for example, and is 0.05 to 0.3 μm in thickness, for example.

The n-type semiconductor layer 12, the p-type semiconductor layer 16, and the p-type contact layer 18 each have a high transmittance (90% or higher, for example), and transmit infrared light. The light absorbing layer 14 absorbs infrared light of 3 to 15 μm in wavelength, for example, and generates photocarriers (electrons and holes). That is, the light receiving element 100 functions as a photodiode.

Mesas 13, a terrace 15, a groove 17, and a terrace 19 are formed in this order from the center toward the outer side. The mesas 13 are arranged in a two-dimensional array in the center of the light receiving element 100. Each mesa 13 functions as a photodiode. The mesas 13 are separated from one another by grooves that reach the n-type semiconductor layer 12, and are electrically connected to one another by the n-type semiconductor layer 12 and the semiconductor substrate 10. The terrace 15 is provided to surround the region in which the mesas 13 are provided. The groove 17 that surrounds the terrace 15 is provided on the outer side of the terrace 15, and the groove 17 is further surrounded by the terrace 19 that is located on the outer side of the groove 17.

The mesas 13 and the terraces 15 and 19 include the n-type semiconductor layer, the light absorbing layer 14, the p-type semiconductor layer 16, and the p-type contact layer 18. The height of the mesas 13 is equal to the height of the terrace 15. The groove 17 reaches the n-type semiconductor layer 12. The width W1 of the terrace 15 shown in FIG. 1A is 50 to 100 µm, for example, the width W2 of the groove 17 is 50 to 200 µm, for example, and the width W3 of the terrace 19 is 55 to 300 µm, for example. The width W1 of the terrace 15 is greater than the width of each mesa 13, and, for example, is at least twice as great as the width of each mesa 13.

As shown in FIG. 1B, the surfaces (the upper surfaces and the side surfaces) of the mesas 13 and the terraces 15 and 19, and the inner surfaces of the groove 17 are coated with an insulating film 20. The insulating film 20 is formed with an insulator such as silicon oxide (SiO2) or silicon nitride (SiN) of 100 to 400 nm in thickness, for example. The insulating film 20 has an opening 20a (the first opening) above the mesas 13, and an opening 20b (the second opening) inside the groove 17. The p-type contact layer 18 is exposed through the opening 20a, and the n-type semiconductor layer 12 is exposed through the opening 20b.

Electrodes 22 are provided on the mesas 13, and are in contact with the p-type contact layer 18 exposed through the opening 20a. An electrode 24 is provided on a portion extending from the terrace 15 to the inside of the groove 17 and to the terrace 19, and is in contact with the n-type semiconductor layer 12 exposed through the opening 20b. The electrodes 22 and 24 are formed with titanium (Ti), platinum (Pt), and gold (Au), which are stacked in this order from the bottom, for example.

Bumps 26 (the first bump) are provided on the mesas 13. The bumps 26 each have a columnar shape, and are in contact with the upper surfaces of the electrodes 22. The p-type contact layer 18, the electrodes 22, and the bumps 26 are electrically connected to one another. A bump 28 (the second bump) is provided on a portion extending from the terrace 15 to the inside of the groove 17. In FIG. 1A, the bump 28 is as a shaded area. As shown in FIG. 1B, the bump 28 is in contact with the surface of the electrode 24. The n-type semiconductor layer 12, the electrode 24, and the bump 28 are electrically connected to one another. The p-type semiconductor layer 16 and the p-type contact layer 18 are of the p-type, and the electrodes 22 function as p-type electrodes. The n-type semiconductor layer 12 has a different conductivity type from that of the p-type semiconductor layer 16 and the like, and is of the n-type. The electrode 24 functions as an n-type electrode. The electrode 24 and the bump 28 have a reference potential (a ground potential, for example). The bumps 26 and 28 are formed with a metal such as indium (In).

As shown in FIG. 1A, the bump 28 has a ring-like shape, and completely surrounds the region in which the mesas 13 are provided in the light receiving element 100. The width W4 of the bump 28 is greater than the diameter R1 of each bump 26, and is at least twice as great as the diameter R1, for example. The diameter R1 of each bump 26 is 8 to 22 µm, for example, and the width W4 of the bump 28 is 50 to 240 µm, for example. The area of the bump 28 in the planar direction (the direction in which the semiconductor substrate 10 extends) is four or more times larger than the area of one bump 26, for example. The height of the bumps 26 and 28 is 6 to 15 µm, for example.

(Light Receiving Device 110)

Figure 2:
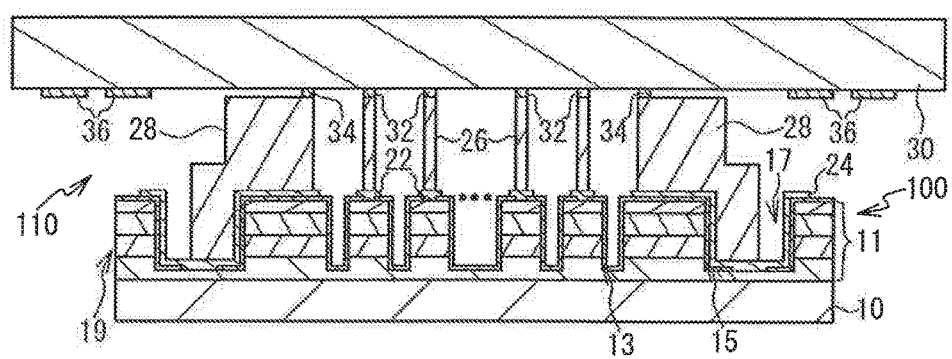
FIG. 2 is a cross-sectional view of an example of a light receiving device.

FIG. 2 is a cross-sectional view of an example of a light receiving device 110. As shown in FIG. 2, the light receiving element 100 is mounted on a substrate 30, to form the light receiving device 110. The substrate 30 is formed with silicon (Si), for example, and includes electrodes 32 and 34, and wiring lines 36. The bumps 26 and 28 are used to electrically connect the light receiving element 100 and the substrate 30. The electrodes 32 are electrically connected to the bumps 26, and the electrode 34 is electrically connected to the bump 28. The wiring lines 36 are not in contact with the bumps of the light receiving element 100.

When infrared light enters from the side of the semiconductor substrate 10, for example, the light absorbing layer 14 of the light receiving element 100 absorbs the infrared light and generates photocarriers (electrons and holes). The photocarriers flow into the substrate 30 via the electrodes 22, the bumps 26, and the electrodes 32, and also flow into the substrate via the electrode 24, the bump 28, and the electrode 34. An electric current generated from the photocarriers flows into the substrate 30, and the substrate 30 generates image information in accordance with the electric current, for example.

(Method of Manufacturing the Light Receiving Element 100)

Figure 3A:
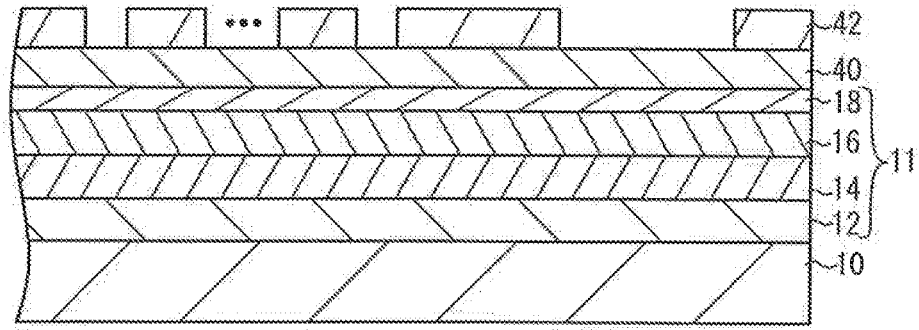
FIGS. 3A through 3D are cross-sectional views illustrating a method of manufacturing the light receiving element.
Figure 3B:
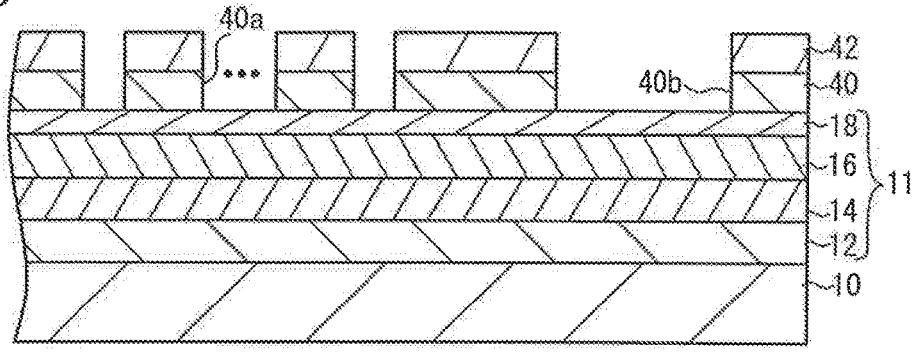

FIGS. 3A through 5C are cross-sectional views illustrating an example of a method of manufacturing the light receiving element 100. As shown in FIG. 3A, the n-type semiconductor layer 12, the light absorbing layer 14, the p-type semiconductor layer 16, and the p-type contact layer 18 are epitaxially grown in sequential order on the semiconductor substrate 10 in a wafer state. Prior to the growth of the n-type semiconductor layer 12, a buffer layer may be grown on the semiconductor substrate 10. In the growth, metal organic chemical vapor deposition (MOCVD), molecular beam epitaxy (MBE), or the like can be used. An insulator film mask layer 40 of SiN, $SiO_2$, or the like is provided on the upper surface of the p-type contact layer 18. A photoresist is applied onto the insulator film mask layer 40, and resist patterning is performed, to form a resist mask 42. As shown in FIG. 3B, with the use of the resist mask 42, dry etching is performed, to shape the insulator film mask layer 40. An opening 40a is formed in the center of the insulator film mask layer 40, and an opening 40b that surrounds the central portion is formed on the outer side. The opening 40a is in a lattice-like form, for example, and the opening 40b is a ring-like groove surrounding the opening 40a.

Figure 3C:
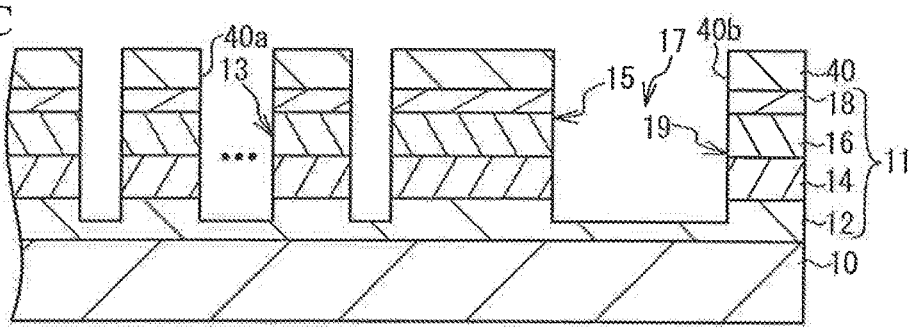
Figure 3D:
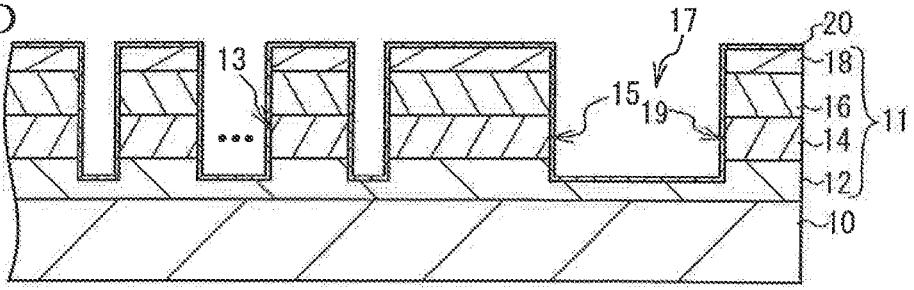

As shown in FIG. 3C, after the resist mask 42 is removed, dry etching with a halogen-based gas is performed, for example. As etching is performed on the portions of the semiconductor layer 11 exposed through the opening 40a or 40b, the mesas 13, the groove 17, and the terraces 15 and 19 are formed. The bottom surface of the groove 17 is the n-type semiconductor layer 12. As shown in FIG. 3D, the insulator film mask layer 40 is removed with buffered hydrofluoric acid or the like. After that, the insulating film 20 is formed by chemical vapor deposition (CVD), for example. The insulating film 20 covers the surfaces of the mesas 13 and the terraces 15 and 19, and the bottom surface of the groove 17.

Figure 4A:
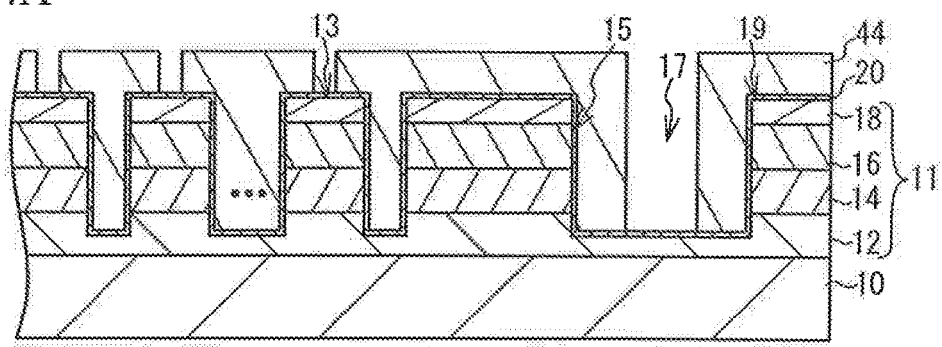
FIGS. 4A through 4C are cross-sectional views illustrating the method of manufacturing the light receiving element.
Figure 4B:
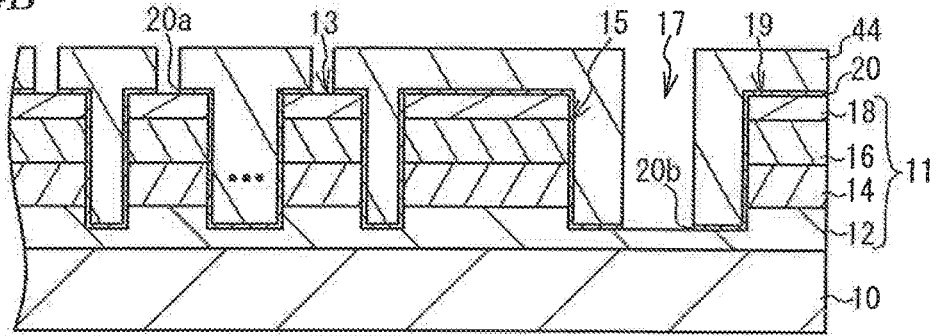
Figure 4C:
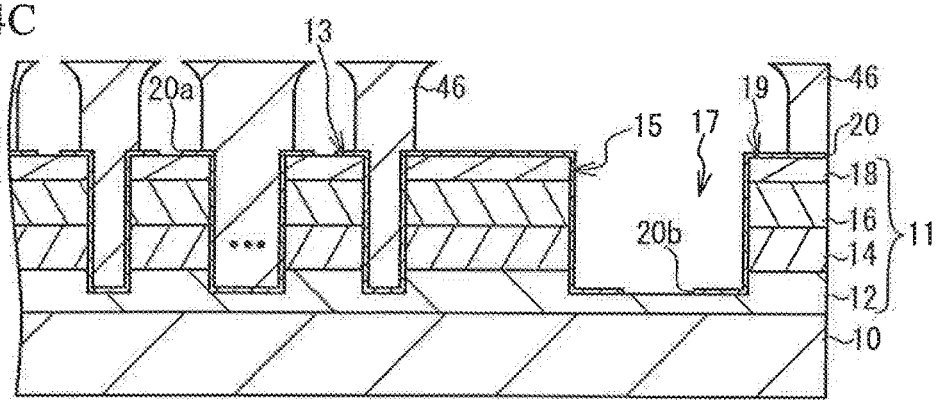

As shown in FIG. 4A, a photoresist is applied onto the insulating film 20, and resist patterning is performed, to form a resist mask 44. Of the insulating film 20, portions on the mesas 13 and a portion inside the groove 17 are exposed through the resist mask 44. As shown in FIG. 4B, the portions of the insulating film 20 exposed through the resist mask 44 are removed by dry etching with a fluorine-based gas or wet etching with buffered hydrofluoric acid, for example. As a result, the openings 20a and 20b are formed in the insulating film 20. As shown in FIG. 4C, after the resist mask 44 is removed, a photoresist is applied, and resist patterning is performed, to form a resist mask 46. Through the resist mask 46, the openings 20a of the insulating film 20 are exposed, and the region of the insulating film 20 extending from the terrace 15 to the terrace 19 via the opening 20b is also exposed. The resist mask 46 has such a shape that its width becomes smaller in the direction from the top toward the semiconductor layer 11.

Figure 5A:
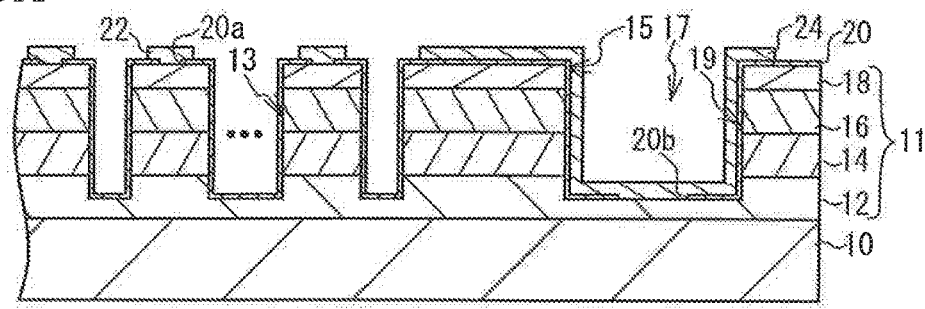
FIGS. 5A through 5C are cross-sectional views illustrating the method of manufacturing the light receiving element.
Figure 5B:
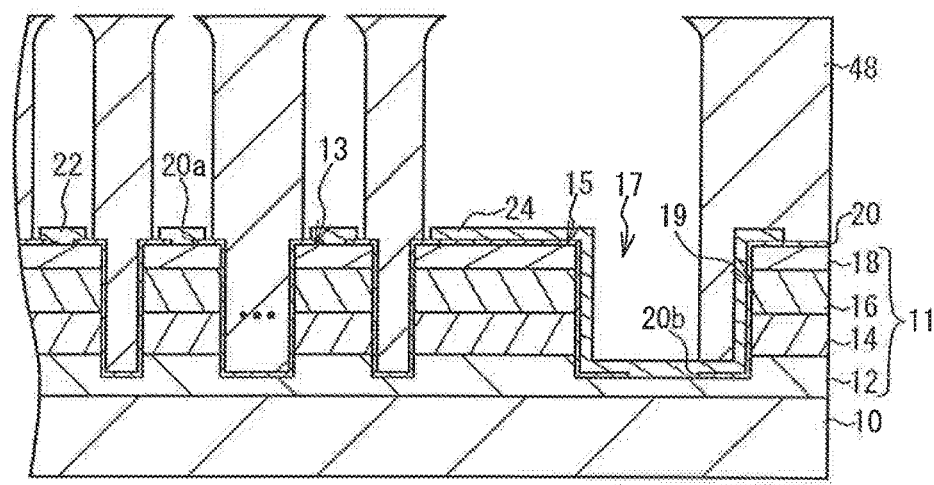
Figure 5C:
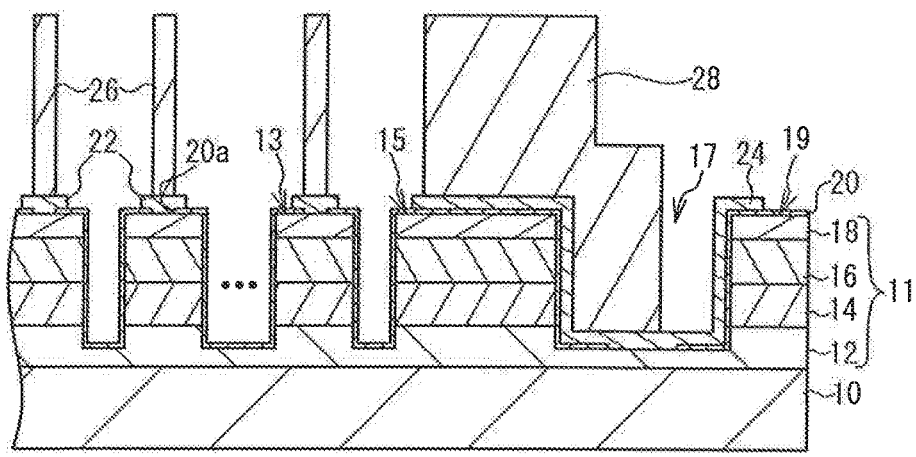

As shown in FIG. 5A, by a vapor deposition technique and a liftoff technique, for example, the electrodes 22 are formed on the upper surface of the p-type contact layer 18 exposed through the openings 20a, and the electrode 24 is formed on a portion extending from the terrace 15 to the inside of the groove 17 and to the terrace 19. The electrode 24 is in contact with the upper surface of the n-type semiconductor layer 12 exposed through the opening 20b. As shown in FIG. 5B, a photoresist is applied, and resist patterning is performed, to form a resist mask 48. Through the resist mask 48, the electrodes 22, and a portion of the electrode 24 extending from the upper surface of the terrace 15 to the inside of the groove 17 are exposed. The resist mask 48 has such a shape that its width becomes smaller in the direction from the top toward the semiconductor layer 11, and has a greater thickness than the resist mask 46. As shown in FIG. 5C, the bumps 26 and 28 are formed by a vapor deposition technique and a liftoff technique. Dicing is performed on the wafer, to form the light receiving element 100.

Comparative Example

Figure 6A:
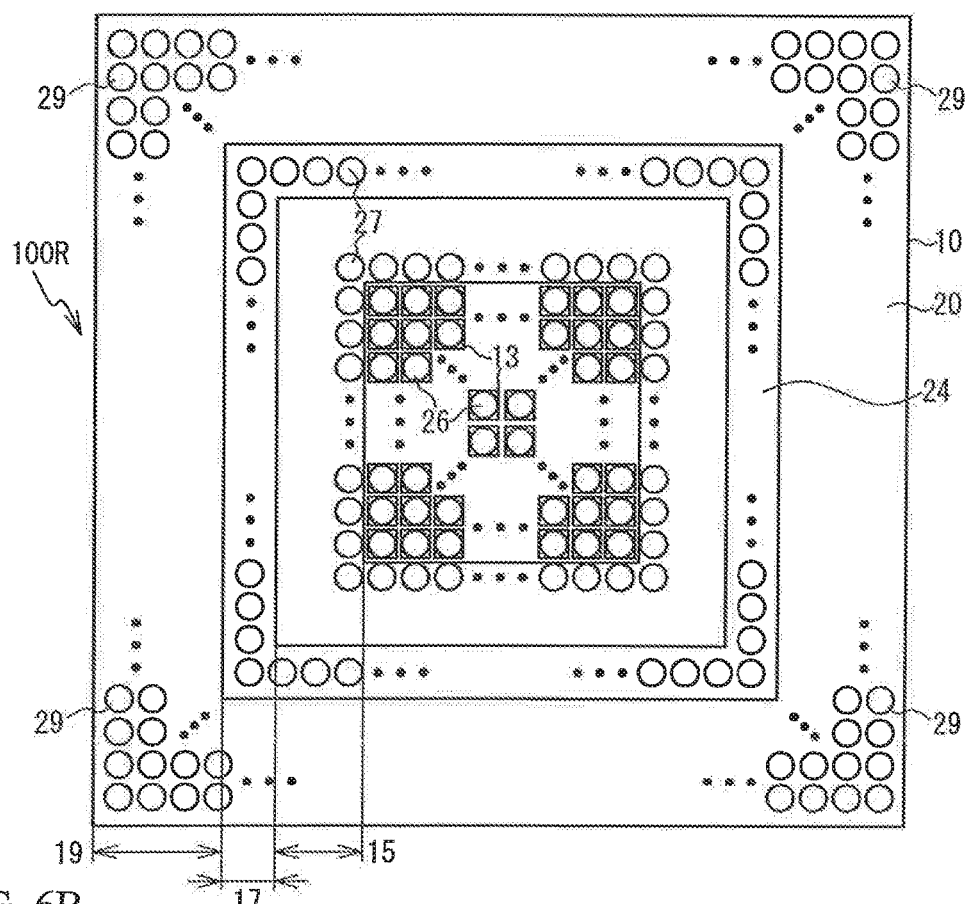
FIG. 6A is a plan view of an example of a light receiving element according to a comparative example.
Figure 6B:
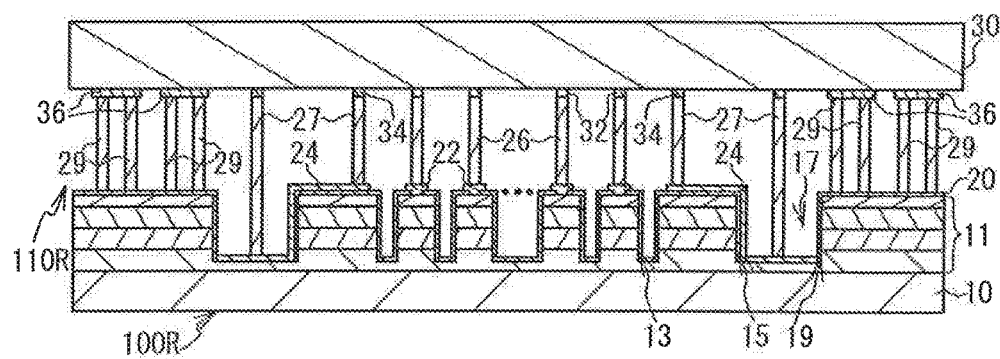
FIG. 6B is a cross-sectional view of an example of a light receiving device according to the comparative example.

FIG. 6A is a plan view of an example of a light receiving element 100R according to a comparative example. FIG. 6B is a cross-sectional view of an example of a light receiving device 110R according to the comparative example. Explanation of the same components as those of the first embodiment is not made herein. As shown in FIGS. 6A and 6B, bumps 27 are provided on the electrode 24, and bumps 29 are provided in a region on the outer side of the groove 17 of the insulating film 20. As shown in FIG. 6B, the bumps 27 are connected to the electrode 34 of the substrate 30, and the bumps 29 are in contact with the wiring lines 36 of the substrate 30. The diameters of the bumps 26, 27, and 29 are equal.

Next, stress is explained. A light receiving device is sometimes used at a low temperature of 77 K, for example. Therefore, the light receiving device is subjected to temperature changes from room temperature to a low temperature and from a low temperature to room temperature, and the light receiving element and the substrate 30 expand or contract due to the temperature changes. The semiconductor substrate 10 of the light receiving element is an n-type GaSb substrate, for example, and has a thermal expansion coefficient of $7.74 \times 10^{-6}$ (K-1). The substrate 30 is formed with Si, for example, and has a thermal expansion coefficient of $3.34 \times 10^{-6}$ (K-1). Due to such a difference in thermal expansion coefficient, the semiconductor substrate 10 is deformed more greatly than the substrate 30. As a result, stress (thermal stress) is applied to the bumps, and the bumps might be detached from the semiconductor substrate 10, for example. Particularly, the outer circumferential portion of the semiconductor substrate is deformed more greatly than the middle portion, and therefore, greater stress is applied to the outer circumferential portion.

In the comparative example shown in FIGS. 6A and 6B, stress is applied to the bumps 29 provided at the outer circumferential portion of the semiconductor substrate 10. Thus, the bumps 26 and 27 are protected from the stress. However, since the bumps 29 are provided at the outer circumferential portion of the semiconductor substrate 10, the size of the semiconductor substrate 10 is large. Further, as shown in FIG. 6B, since the bumps 29 are in contact with the wiring lines 36 of the substrate 30, stress is also applied to the wiring lines 36, and the wiring lines 36 might be damaged.

In this embodiment, on the other hand, the bump 28 is provided on the terrace 15 on the outer side of the mesas 13, as shown in FIGS. 1A through 2. Since the bump 28 is provided on the outer side of the bumps 26, the stress to be applied to the bump 28 is greater than the stress to be applied to the bumps 26. However, the bump 28 has a larger size (width) than the bumps 26, and the contact area between the bump 28 and the electrode 24 is large. Accordingly, the joint strength is also high. Thus, even if stress is applied to the bump 28, detachment of the bump 28 from the electrode 24 is prevented. Further, as the bump 28 has high strength, damage (such as cracking) of the bump 28 due to stress is prevented. Since stress concentrates on the bump 28, the stress to be applied to the bumps 26 is smaller than the stress to be applied to the bump 28. Thus, detachment of the bumps 26 from the electrodes 22 is prevented. In this manner, damage of the light receiving element 100 and the light receiving device 110 due to stress can be prevented.

Since there is no need to provide a large number of bumps 29 at the outer circumferential portion of the semiconductor substrate 10, the light receiving element 100 can be made smaller in size. The bump 28 should be located to face the electrode 34 of the substrate 30, but does not need to face the wiring lines 36. Therefore, the semiconductor substrate 10 does not need to have such a large size as to face the wiring lines 36, as long as the semiconductor substrate 10 faces the electrode 34. As a result, the light receiving element 100 can be made smaller in size than that of the comparative example. The bump 28 is joined to the electrode 34 of the substrate 30, and is not in contact with the wiring lines 36. Thus, any force is not applied from the bump 28 to the wiring lines 36, and the wiring lines 36 are not damaged.

The area of the bump 28 in the planar direction (the direction in which the semiconductor substrate 10 extends) is four or more times larger than the area of one bump 26, for example. As the contact area between the bump 28 and the electrode 24 is larger, the joint strength is much higher. Thus, detachment of the bump 28 is effectively prevented. The area of the bump 28 may also be two, eight, or ten or more times larger than the area of the bumps 26, for example.

As shown in FIG. 1B, the bump 28 is provided on a portion extending from the terrace 15 to the inside of the groove 17, and covers the surface of the electrode 24. The electrode 24 is easily broken on the side surfaces of the terrace 15 or the like. However, the bump 28 covers the electrode 24 also on the side surfaces of the terrace 15, and thus, breaking is prevented. Furthermore, the contact area between the bump 28 and the electrode 24 is a wide region extending from the terrace 15 to the groove 17, and the joint strength is high accordingly. Because of this, detachment of the bump 28 is prevented. Further, the bump 28 has a great width extending from the terrace 15 to the groove 17, and thus, damage of the bump 28 due to stress is prevented.

As shown in FIG. 1A, the bump 28 has a ring-like shape, and surrounds the region in which the mesas 13 are provided in the semiconductor layer 11. Because of this arrangement, the contact area between the bump 28 and the electrode 24 is larger, and the joint strength is higher. Thus, detachment of the bump 28 is effectively prevented. Furthermore, stress concentrates on the bump 28 in all directions in the plane, and the stress to be applied to the bump 26 is small. A particularly great stress is applied to the four corners of the semiconductor substrate 10, but the ring-like bump 28 protects the inner bumps 26 and the like from the stress. Thus, damage of the light receiving element 100 due to stress can be prevented.

The insulating film 20 covers the upper and side surfaces of the respective mesas 13 and the respective terraces 15. With this, the semiconductor layer 11 can be protected from foreign matter, moisture, and the like. Further, the insulating film 20 is interposed between the electrode 24 and the light absorbing layer 14, the p-type semiconductor layer 16, and the p-type contact layer 18. With this arrangement, these layers are insulated. In the openings 20a of the insulating film 20, the electrodes 22 are in contact with the p-type contact layer 18. In the opening 20b, the electrode 24 is in contact with the n-type semiconductor layer 12. With this arrangement, the electrodes 22 function as p-type electrodes, and the electrode 24 functions as an n-type electrode.

Second Embodiment

Figure 7A:
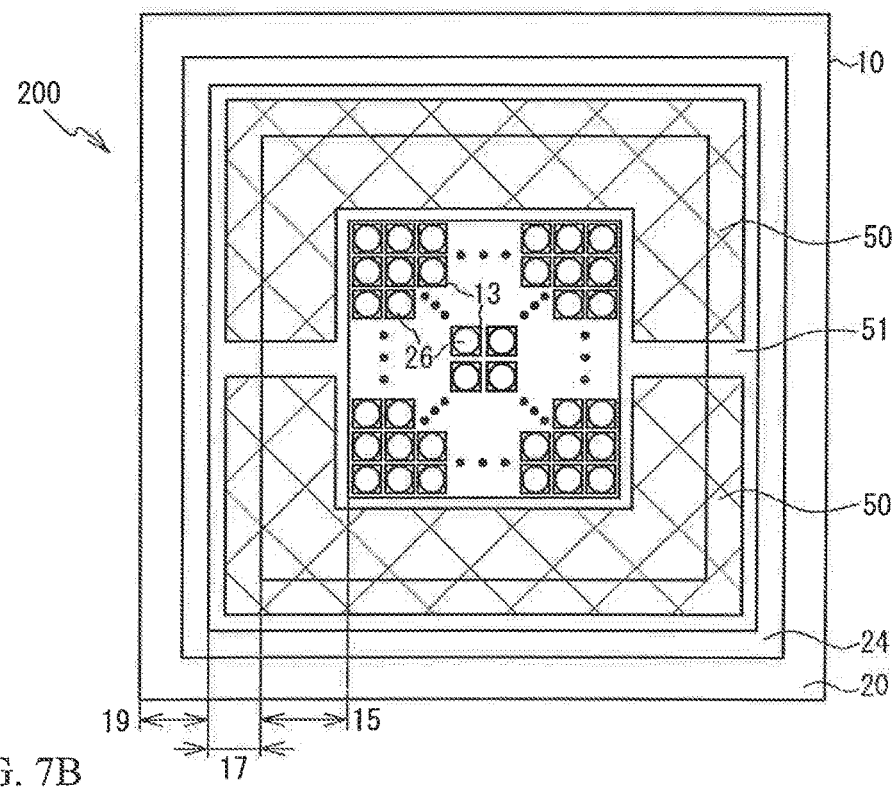
FIG. 7A is a plan view of an example of a light receiving element according to a second embodiment.

FIG. 7A is a plan view of an example of a light receiving element 200 according to a second embodiment. Explanation of the same components as those of the first embodiment is not made herein. As shown in FIG. 7A, two U-shaped bumps 50 are provided, and the region in which the mesas 13 are provided is surrounded by the two bumps 50. Each bump 50 extends along three sides of the semiconductor substrate 10. The width of one bump 50 is greater than the diameter of one bump 26, and the area of the bumps 50 is four or more larger than the area of the bumps 26, for example. A gap 51 is formed between the bumps 50, and the middle portion of the semiconductor substrate 10 on which the mesas 13 are disposed continues to the outer peripheral portion of the semiconductor substrate 10 via the gap 51.

Figure 7B:
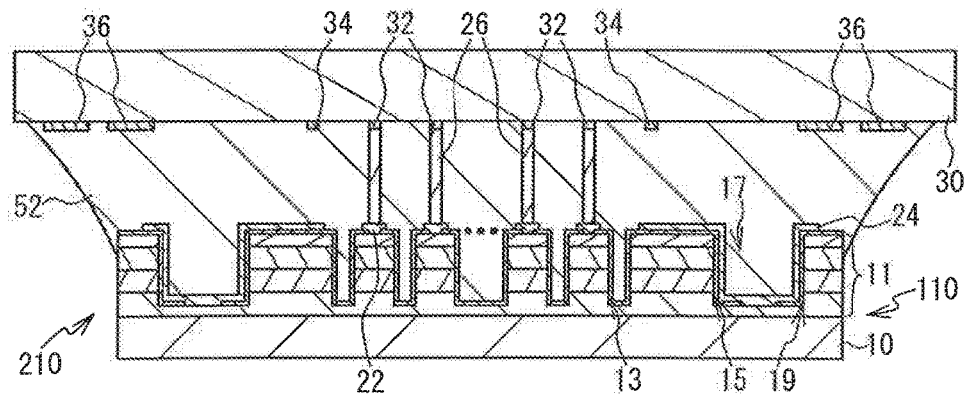
FIG. 7B is a cross-sectional view of an example of a light receiving device according to the second embodiment.

FIG. 7B is a cross-sectional view of an example of a light receiving device 210. The space between the light receiving element 200 and the substrate 30 is filled with an underfill 52. After the bumps 26 are connected to the electrodes 32 of the substrate 30, and the bumps 50 are connected to the electrode 34, a resin (the underfill 52) is injected with a syringe or the like through the gap 51. The underfill 52 is then solidified, so that the light receiving device 210 is formed.

Like the first embodiment, the second embodiment can prevent damage of the light receiving element 200 and the light receiving device 210 due to stress, and prevent increase in the size of the light receiving element 200 and damage of the substrate 30. It is also possible to inject the underfill 52 or the like toward the middle portion of the light receiving element 200 through the gap 51 between the bumps 50. Thus, the stress to be applied to the light receiving element 200 and the substrate 30 can be reduced by the underfill 52.

Third Embodiment

Figure 8:
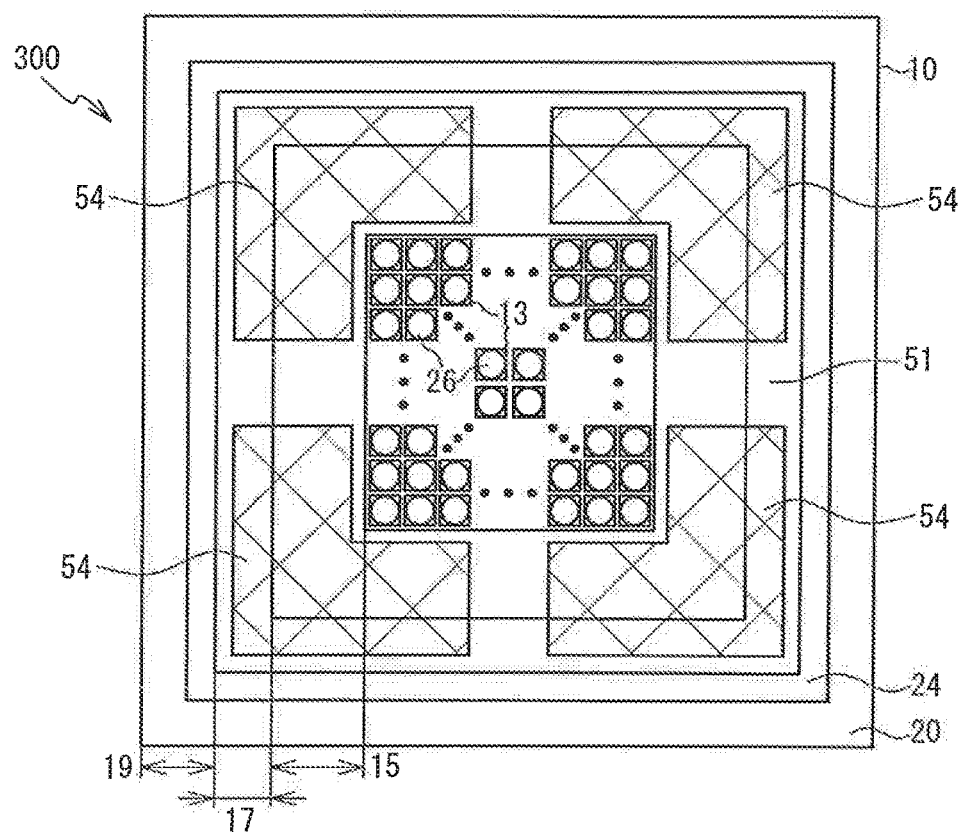
FIG. 8 is a plan view of an example of a light receiving element according to a third embodiment.

FIG. 8 is a plan view of an example of a light receiving element 300 according to a third embodiment. Explanation of the same components as those of the first embodiment is not made herein. As shown in FIG. 8, four L-shaped bumps 54 are provided, and the region in which the mesas 13 are provided is surrounded by the four bumps 54. One bump 54 is disposed to extend along two sides of the semiconductor substrate 10. The width of one bump 54 is greater than the diameter of one bump 26, and the area of the bumps 54 is four or more times larger than the area of the bumps 26, for example. The four bumps 54 form a square, and the respective bumps 54 are located at the four corners of the square. Each two bumps 54 are at a distance from each other, and a gap 51 is formed in between. Each bump 54 is used to connect the light receiving element 300 and the substrate.

Like the first embodiment, the third embodiment can prevent damage of the light receiving element 300 and a light receiving device due to stress, and prevent increase in the size of the light receiving element 300 and damage of the substrate 30. Also, the underfill 52 is injected through the gap 51, so that the stress to be applied to the light receiving element 300 and the substrate 30 can be reduced. The number of the bumps 54 may be three, or may be four or larger. Even if one of the bumps 54 is detached due to stress, for example, the other bumps 54 should be connected to the electrodes 24 and 34. Particularly, the bumps 54 are preferably provided at the respective four corners of the semiconductor substrate 10 to which a great stress is applied. In the second and third embodiments, each bump extends along at least two sides of the semiconductor substrate 10, and the bumps are provided at the four corners of a square.

Fourth Embodiment

Figure 9:
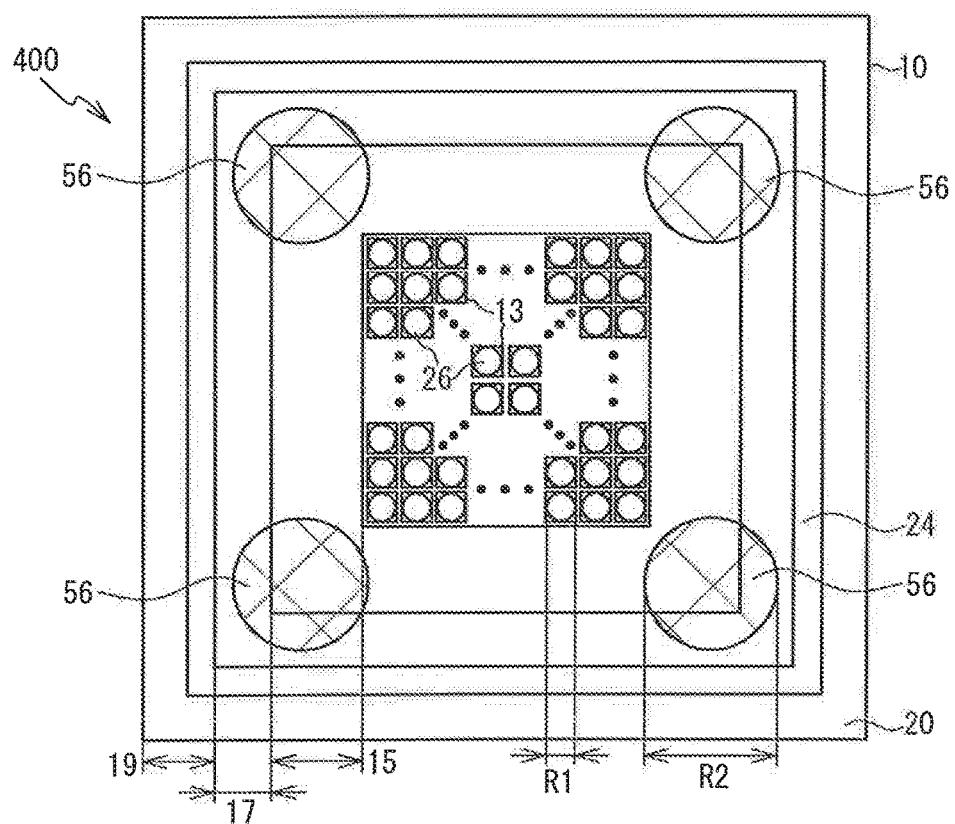
FIG. 9 is a plan view of an example of a light receiving element according to a fourth embodiment.

FIG. 9 is a plan view of an example of a light receiving element 400 according to a fourth embodiment. Explanation of the same components as those of the first embodiment is not made herein. As shown in FIG. 9, four columnar bumps 56 are provided. The four bumps 56 form a square, and the respective bumps 56 are located at the four corners of the square. The diameter R2 of the bumps 56 is greater than the diameter R1 of the bumps 26, and is at least twice as great as R1, for example. The area of the bumps 56 is four or more times larger than the area of the bumps 26, for example.

Like the first embodiment, the fourth embodiment can prevent damage of the light receiving element 400 and a light receiving device due to stress, and prevent increase in the size of the light receiving element 400 and damage of the substrate 30. Also, the underfill 52 is injected through a gap between the bumps 56, so that the stress to be applied to the light receiving element 400 and the substrate 30 can be reduced. The number of the bumps 56 is preferably at least three, and may be four or larger. Particularly, the bumps 56 are preferably provided at the respective four corners of the semiconductor substrate 10 to which a great stress is applied.

In the first through fourth embodiments, the semiconductor substrate 10 is formed with GaSb, and the substrate 30 is formed with Si. The semiconductor substrate 10 and the substrate 30 have different thermal expansion coefficients, and stress might be generated because of the difference. According to the first through fourth embodiments, it is possible to prevent damage due to stress by adopting a bump with a great width. Meanwhile, the n-type semiconductor layer 12, the light absorbing layer 14, and the p-type semiconductor layer 16, which have superlattice structures, are matched to the semiconductor substrate 10 formed with GaSb. The semiconductor substrate 10 may be formed with some other compound semiconductor. The substrate 30 may be formed with a semiconductor other than Si, or an insulator or the like.

In a case where the light receiving element is an infrared sensor that receives infrared light, the light receiving element is cooled to liquid nitrogen temperature (77 K), for example, prior to operation. Due to the temperature change at the time of the cooling, a great stress is generated. According to the first through fourth embodiments, a bump with a great width is adopted, so that damage due to stress can be prevented.

The n-type semiconductor layer 12 is an n-type superlattice layer formed with GaSb/InAs, and the p-type semiconductor layer 16 is a p-type superlattice layer formed with GaSb/InAs. The n-type semiconductor layer 12 and the p-type semiconductor layer 16 should have different conductivity types from each other, one of the semiconductor layers being of the n-type, the other being of the p-type. The n-type semiconductor layer 12, the light absorbing layer 14, and the p-type semiconductor layer 16 may be formed with some other semiconductor, such as a compound semiconductor having a structure other than a GaSb/InAs superlattice structure. The light absorbing layer 14 absorbs light at different wavelengths outside the infrared band, and the n-type semiconductor layer 12 and the p-type semiconductor layer 16 may have a high transmittance (90% or higher, for example) for light having such wavelengths.

What is claimed is:

1. A light receiving element comprising:
   a semiconductor substrate formed with a compound semiconductor,
   a semiconductor layer including: a first layer that is provided on the semiconductor substrate and is of a first conductivity type; a light absorbing layer provided on the first layer; a second layer that is provided on the light absorbing layer and is of a second conductivity type; and a third layer that is provided on the second layer and is of the second conductivity type, the semiconductor layer forming a plurality of mesas, a terrace, and a groove at a portion of the semiconductor substrate extending from a middle portion thereof toward an outer peripheral portion thereof;
   a first electrode that is provided on at least one of the mesas, and is electrically connected to the third layer,
   a first bump that is provided on the first electrode, and is electrically connected to the first electrode;
   a second electrode that is provided on a portion extending from the terrace to an inner side of the groove, and is electrically connected to the first layer; and
   a second bump that has a larger size than the first bump, that is provided on the terrace, and that is electrically connected to the second electrode, wherein
   the mesas and the terrace include the first layer, the light absorbing layer, the second layer, and the third layer,
   the groove extends to the first layer, and
   the second electrode is in contact with the first layer on an inner side of the groove.

2. The light receiving element according to claim 1, wherein an area of the second bump in a direction in which the semiconductor substrate extends is at least four times larger than an area of the first bump.

3. The light receiving element according to claim 1, wherein the second bump is provided on a portion of the semiconductor substrate extending from the terrace to an inner side of the groove, and covers a surface of the second electrode.

4. The light receiving element according to claim 1, further comprising
   an insulating film that covers respective upper and side surfaces of the mesas and the terrace, wherein
   the insulating film has a first opening above the mesas, and a second opening on an inner side of the groove,
   the first electrode is in contact with the third layer exposed through the first opening, and
   the second electrode is in contact with the first layer exposed through the second opening.

5. The light receiving element according to claim 1, wherein the second bump has a ring-like shape, and surrounds a region of the semiconductor layer, the plurality of mesas being provided in the region.

6. The light receiving element according to claim 1, further comprising a plurality of second bumps, wherein
   each second bump has a shape that extends along at least two sides of the semiconductor substrate, and
   the second bumps are at a distance from one another and form a square, the second bumps being located at respective four corners of the square.

7. The light receiving element according to claim 1, wherein the second bump is formed by four columnar bumps, the four columnar bumps forming a square and each of the columner bumps being located at a respective corner of the square.

8. The light receiving element according to claim 1, wherein the semiconductor substrate is formed with gallium antimonide.

9. The light receiving element according to claim 1, wherein
   the first layer is an n-type superlattice layer, and
   the second layer is a p-type superlattice layer.

10. A light receiving device comprising:
    a silicon substrate, and
    a light receiving element electrically connected to the silicon substrate, the light receiving element including:
    a semiconductor substrate formed with a compound semiconductor;
    a semiconductor layer including: a first layer that is provided on the semiconductor substrate and is of a first conductivity type; a light absorbing layer provided on the first layer; a second layer that is provided on the light absorbing layer and is of a second conductivity type; and a third layer that is provided on the second layer and is of the second conductivity type, the semiconductor layer forming a plurality of mesas, a terrace, and a groove at a portion of the semiconductor substrate extending from a middle portion thereof toward an outer peripheral portion thereof;
    a first electrode that is provided on at least one of the mesas, and is electrically connected to the third layer;
    a first bump that is provided on the first electrode, and is electrically connected to the first electrode;
    a second electrode that is provided on a portion extending from the terrace to an inner side of the groove, and is electrically connected to the first layer; and
    a second bump that has a larger size than the first bump, that is provided on the terrace, and that is electrically connected to the second electrode, wherein
    the mesas and the terrace include the first layer, the light absorbing layer, the second layer, and the third layer, the groove extends to the first layer, and
the second electrode is in contact with the first layer on an inner side of the groove, and wherein
the first bump and the second bump of the light receiving element electrically connect the light receiving element to the silicon substrate.

\* \* \* \* \*